(12) United States Patent
Chuang et al.

(10) Patent No.: US 10,034,410 B1
(45) Date of Patent: Jul. 24, 2018

(54) SUPPORT APPARATUS

(71) Applicant: CHROMA ATE INC., Tao-Yuan (TW)

(72) Inventors: Sheng-Chin Chuang, Tao-Yuan (TW);
Kuei-Wen Lien, Tao-Yuan (TW);
Chung-Lin Liu, Tao-Yuan (TW);
Ming-Ju Chuang, Tao-Yuan (TW);
Hsiu-Wei Kuo, Tao-Yuan (TW);
Ming-Hui Wang, Tao-Yuan (TW);
Chih-Hsien Wang, Tao-Yuan (TW)

(73) Assignee: CHROMA ATE INC., Tao-Yuan (TW)

( * ) Notice: Subject to any disclaimer, the term of this patent is extended or adjusted under 35 U.S.C. 154(b) by 0 days.

(21) Appl. No.: 15/497,231

(22) Filed: Apr. 26, 2017

(51) Int. Cl.
*H05K 7/20* (2006.01)
*H05K 5/02* (2006.01)

(52) U.S. Cl.
CPC ....... *H05K 7/20009* (2013.01); *H05K 5/0217* (2013.01)

(58) Field of Classification Search
CPC .......... H05K 7/20009–7/20209; H05K 5/0217
USPC .................................................. 361/694–697
See application file for complete search history.

(56) References Cited

U.S. PATENT DOCUMENTS

| 7,334,327 | B1* | 2/2008 | Chen | H01R 43/24 264/104 |
| 2002/0011859 | A1* | 1/2002 | Smith | G01R 1/0483 324/755.08 |
| 2011/0275241 | A1* | 11/2011 | Zhang | B65D 85/38 439/527 |
| 2015/0208814 | A1* | 7/2015 | Alletto, Jr. | A47C 21/042 5/423 |
| 2015/0318126 | A1* | 11/2015 | Hessler | H01L 23/4334 200/5 R |
| 2016/0012835 | A1* | 1/2016 | Zhong | G11B 5/41 134/198 |
| 2016/0305559 | A1* | 10/2016 | Cho | B65G 47/91 |
| 2017/0318979 | A1* | 11/2017 | Rawls-Meehan | A47C 21/044 |

* cited by examiner

Primary Examiner — David M Sinclair
Assistant Examiner — Robert Brown
(74) Attorney, Agent, or Firm — CKC & Partners Co., Ltd.

(57) ABSTRACT

A support apparatus is configured to support electronic components. The support apparatus includes a tray and a plurality of recessed structures. The tray has a cavity therein and at least one intake hole communicated with the cavity. The recessed structures are disposed on the tray and recessed toward the cavity. Each of the recessed structures is configured to accommodate at least a part of a corresponding one of the electronic components and includes a support surface and a plurality of first spacers. The support surface has an exhaust hole communicated with the cavity. The first spacers are disposed on the support surface of a corresponding one of the recessed structures. When a corresponding one of the electronic components is supported on the first spacers, any adjacent two of the first spacers and the corresponding electronic component form a first flow channel.

10 Claims, 5 Drawing Sheets

SUPPORT APPARATUS

BACKGROUND

Technical Field

The present disclosure relates to a support apparatus.

Description of Related Art

In general, before leaving the factory, a set of batteries will be placed on a support tray, and an electrical testing (e.g., discharge or charge test) will be performed to the batteries by a battery inspection device. In order to avoid overheating of the batteries during the aforementioned inspection process, some manufacturers use fans to dissipate the heat of the batteries on the support tray.

However, the approach of dissipating heat by using the fans cannot uniformly maintain the temperature of the batteries on the support tray. For example, the heat of the battery closer to the fans is easy to be dissipated, thereby having a lower temperature. On the contrary, the heat of the battery farther to the fans is difficult to be dissipated, thereby having a higher temperature. If the temperature deviations among the batteries are large during the inspection process, it is likely to cause problems on battery problem determination. For example, when the temperatures of some batteries are too high, it cannot be accurately determined whether it is because the fans unevenly dissipate the heat or the batteries themselves are abnormal.

SUMMARY

An aspect of the disclosure is to provide a support apparatus to solve the aforementioned problem.

According to an embodiment of the disclosure, a support apparatus is configured to support electronic components. The support apparatus includes a tray and a plurality of recessed structures. The tray has a cavity therein and at least one intake hole communicated with the cavity. The recessed structures are disposed on the tray and recessed toward the cavity. Each of the recessed structures is configured to accommodate at least a part of a corresponding one of the electronic components and includes a support surface and a plurality of first spacers. The support surface has an exhaust hole communicated with the cavity. The first spacers are disposed on the support surface of a corresponding one of the recessed structures. When a corresponding one of the electronic components is supported on the first spacers, any adjacent two of the first spacers and the corresponding electronic component form a first flow channel.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
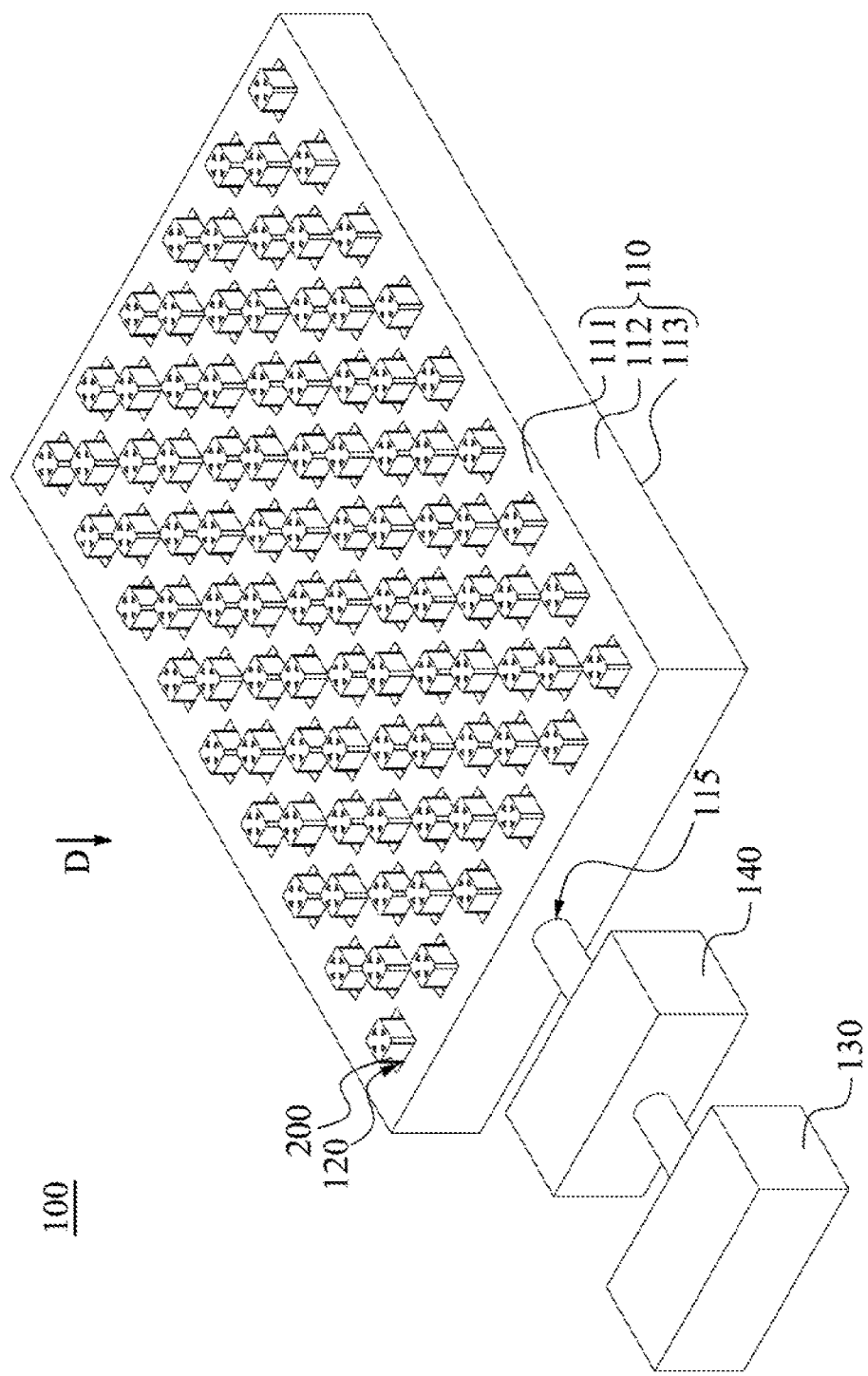
FIG. 1 is a perspective view of a support apparatus supporting electronic components according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a perspective view of a support apparatus 100 supporting electronic components 200 according to an embodiment of the disclosure.

As shown in FIG. 1, in the embodiment, the support apparatus 100 is configured to support a plurality of electronic components 200. Specifically, the support apparatus 100 includes a tray 110, a plurality of recessed structures 120, a gas supply module 130, and a thermostat module 140. The detailed structures and functions of the aforementioned components of the support apparatus 100 and the relationships among these components will be introduced in detail below.

Figure 2:
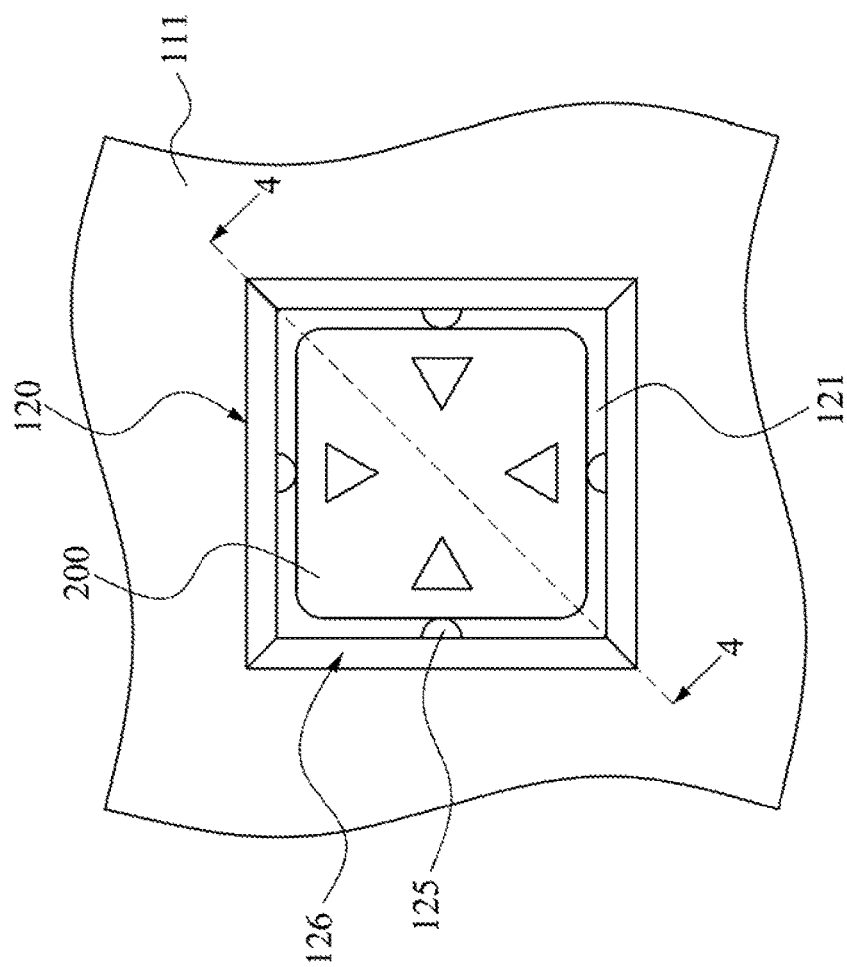
FIG. 2 is a partial top view of the support apparatus and an electronic component in FIG. 1.
Figure 3:
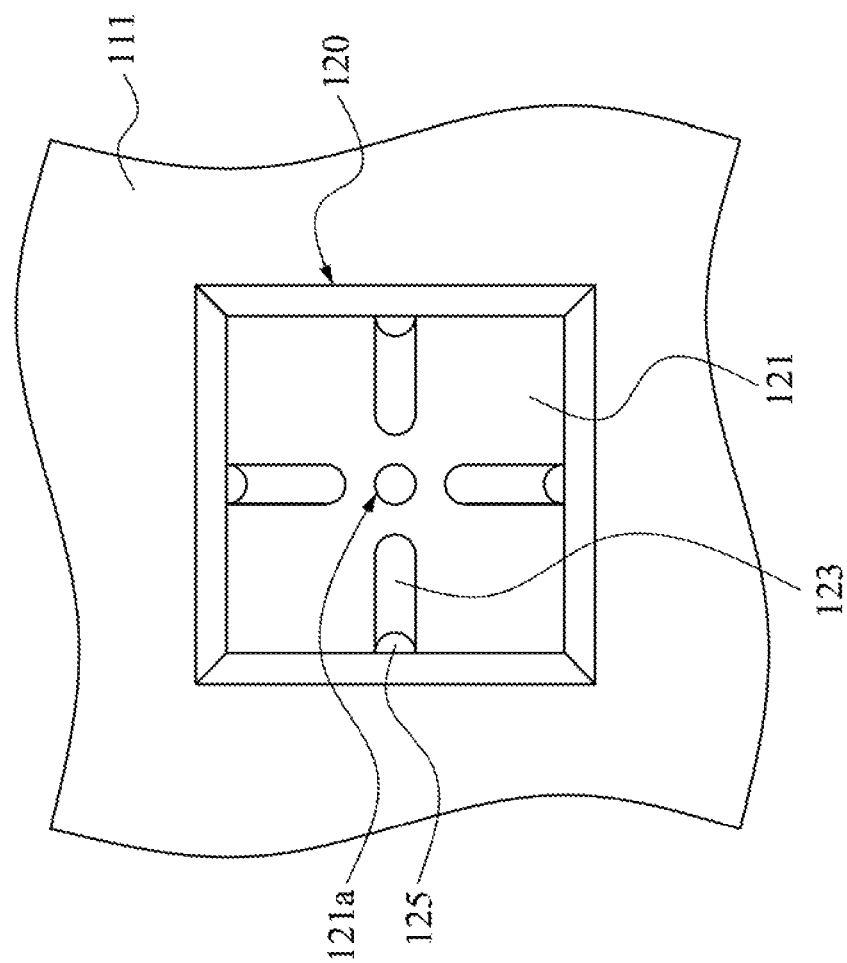
FIG. 3 is a partial top view of the support apparatus in FIG. 1.
Figure 4:
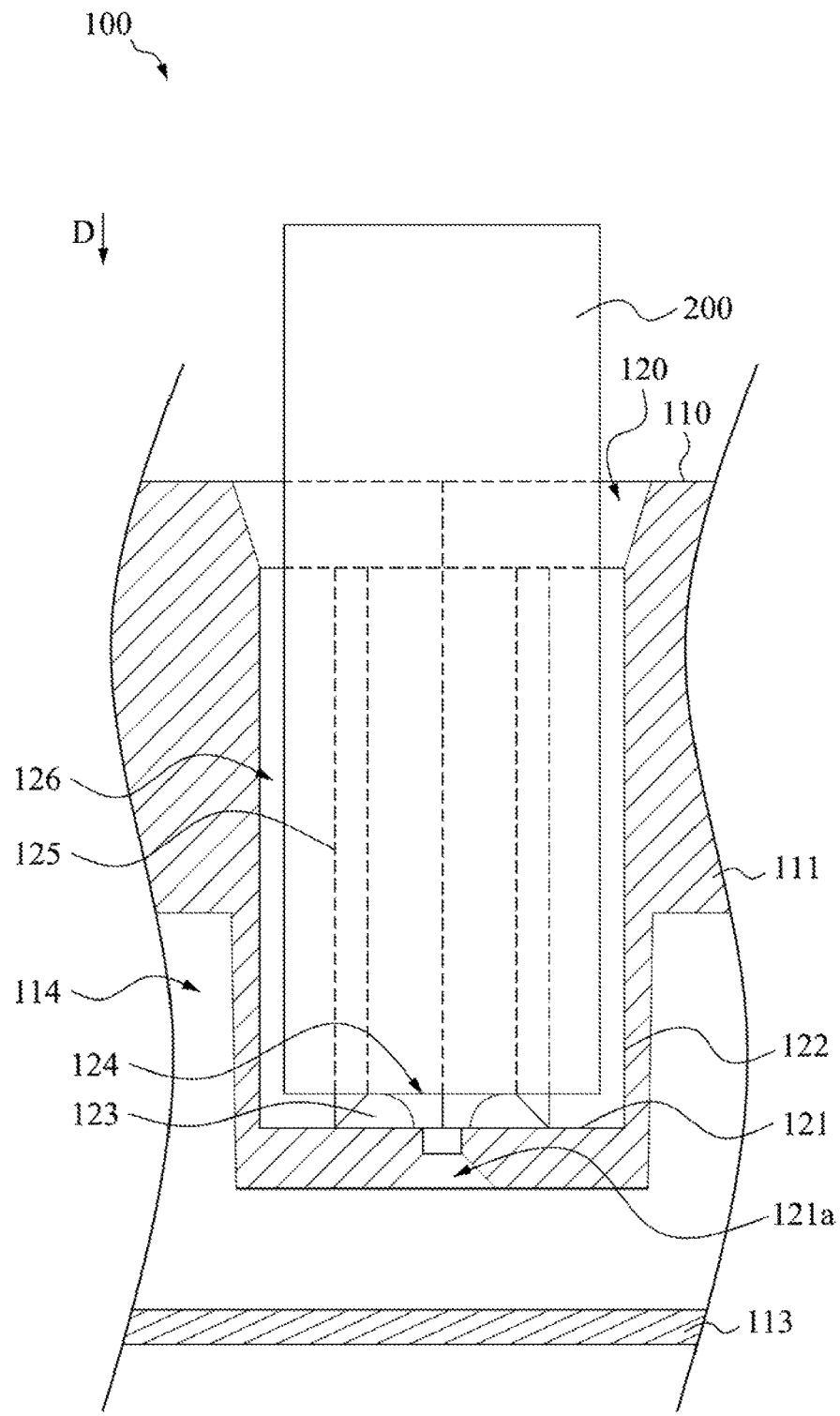
FIG. 4 is a partial cross-sectional view of the support apparatus in FIG. 2 taken along line 4-4 according to an embodiment.

Reference is made to FIGS. 2-4. FIG. 2 is a partial top view of the support apparatus 100 and an electronic component 200 in FIG. 1. FIG. 3 is a partial top view of the support apparatus 100 in FIG. 1. FIG. 4 is a partial cross-sectional view of the support apparatus 100 in FIG. 2 taken along line 4-4 according to an embodiment.

As shown in FIGS. 3 and 4, in the embodiment, the tray 110 of the support apparatus 100 has a cavity 114 (see FIG. 4) therein and at least one intake hole 115 communicated with the cavity 114. The recessed structures 120 of the support apparatus 100 are disposed on the tray 110 (see FIG. 1) and recessed toward the cavity 114 along a direction D. In practical application, the recessed structures 120 can be randomly arranged on the tray 110 or arranged on the tray 110 according to a matrix.

As shown in FIG. 1, in the embodiment, each of the recessed structures 120 is configured to accommodate at least a part of a corresponding one of the electronic components 200. Hence, when one of the electronic components 200 is accommodated in the corresponding recessed structure 120, the part of the electronic component 200 exposed out of the corresponding recessed structure 120 is convenient for an inspection device (not shown) to perform an electrical testing to the electronic component 200. For example, the electronic component 200 is a battery, and the inspection device is a battery inspection device, but the disclosure is not limited in this regard.

As shown in FIGS. 3 and 4, in the embodiment, each of the recessed structures 120 includes a support surface 121. The support surface 121 of each of the recessed structures 120 has an exhaust hole 121a communicated with the cavity 114 in the tray 110. The gas supply module 130 of the support apparatus 100 is connected to the intake hole 115 and configured to supply a gas to the cavity 114. The gas in the cavity 114 will enter the recessed structures 120 via the exhaust holes 121a on the support surfaces 121 and then flow through the surfaces of the electronic components 200, so as to dissipate the heat produced by the electronic components 200.

As shown in FIG. 1, in the embodiment, the thermostat module 140 is connected between the intake hole 115 of the tray 110 and the gas supply module 130, and is configured to adjust the temperature of the gas. Therefore, the inspector can adjust the gas to a predetermined temperature according to specific detection standards or demands, such that the electronic components 200 can be properly heated or cooled by the gas of the predetermined temperature.

As shown in FIG. 4, in the embodiment, a portion of each of the exhaust holes 121a adjoining the cavity 114 has a first aperture A1, a portion of each of the exhaust holes 121a adjoining the support surface 121 has a second aperture A2 smaller than the first aperture A1. Hence, while entering the recessed structures 120 via the exhaust holes 121a, the gas in the cavity 114 will be pressurized by the exhaust holes 121a to form jet airflows. The jet airflows can forcibly dissipate the heat produced by the electronic components 200, so that the cooling efficiency to the electronic components 200 can be further improved.

In some embodiments, the gas supply module 130 of the support apparatus 100 can make the gas form a high static pressure in the cavity 114. Hence, under the condition that the exhaust holes 121a on the support surfaces 121 of the recessed structures 120 have the same geometric shape, it can be ensured that the flows of the gas entering the recessed structures 120 respectively from the exhaust holes 121a have the same flow rate. In other words, the support apparatus 100 of the embodiment can provide a uniform cooling effect to all of the electronic components 200, and there is no difference depending on the positions of the electronic components 200.

As shown in FIGS. 2-4, in the embodiment, each of the recessed structures 120 further includes a plurality of first spacers 123. The first spacers 123 are disposed on the support surface 121 of a corresponding one of the recessed structures 120 and configured to support the corresponding one of the electronic components 200. In detail, the first spacers 123 in each of the recessed structures 120 are radially arranged relative to the corresponding exhaust hole 121a, as shown in FIG. 3. Hence, the corresponding electronic component 200 can be steady supported on the first spacers 123 in the recessed structure 120.

It should be pointed out that because the first spacers 123 in each of the recessed structures 120 are radially arranged relative to the corresponding exhaust hole 121a, when a corresponding one of the electronic components 200 is supported on the first spacers 123, any adjacent two of the first spacers 123 and the corresponding one of the electronic components 200 form a first flow channel 124. For example, as shown in FIG. 3, each of the recessed structures 120 includes four first spacers 123, so these first spacers 123 and the corresponding electronic component 200 can form four first flow channels 124. However, in practical applications, the number of the first spacers 123 of each of the recessed structures 120 is not limited in this regard and can be flexibly modified as needed.

With the foregoing structural configurations, the gas flows into the first flow channels 124 from the exhaust hole 121a can uniformly dissipate the heat produced at the bottom of the corresponding electronic component 200.

As shown in FIGS. 2-4, in the embodiment, each of the recessed structures 120 further has a sidewall 122 connected to the support surface 121 thereof and includes a plurality of second spacers 125 disposed on the sidewall 122. The second spacers 125 are respectively connected to the corresponding first spacers 123 and configured to be abutted against by a corresponding one of the electronic components 200. When a corresponding one of the electronic components 200 is supported on the first spacers 123, any adjacent two of the second spacers 125 and the corresponding one of the electronic components 200 form a second flow channel 126 communicated with a corresponding one of the first flow channels 124. For example, as shown in FIG. 2, each of the recessed structures 120 includes four second spacers 125, so these second spacers 125 and the corresponding electronic component 200 can form four second flow channels 126. However, in practical applications, the number of the second spacers 125 of each of the recessed structures 120 is not limited in this regard and can be flexibly modified according to the number of the first spacers 123 as needed.

With the foregoing structural configurations, the gas flows into the second flow channels 126 from the first flow channels 124 can uniformly dissipate the heat produced at the side surface of the corresponding electronic component 200 out of the opening of the recessed structure 120.

As shown in FIGS. 2-4, in the embodiment, the second spacers 125 in each of the recessed structures 120 extend along the direction D. Hence, the gas flows into the second flow channels 126 from the first flow channels 124 can rapidly dissipate the heat produced at the side surface of the corresponding electronic component 200.

As shown in FIGS. 1 and 4, in the embodiment, the tray 110 further has a support board 111, a connection board 112, and a base board 113 sequentially connected to form the cavity 114. The recessed structures 120 are disposed on the support board 111 and recessed toward the base board 113 along the direction D. The intake hole 115 is located at the connection board 112. Because the intake hole 115 is located at the connection board 112, the gas provided by the gas supply module 130 can smoothly reach all of the exhaust holes 121a. Hence, after entering the cavity 114 of the tray 110, the gas can reach all of the exhaust holes 121a without changing its direction, so the pressure loss can be effectively reduced.

Figure 5:
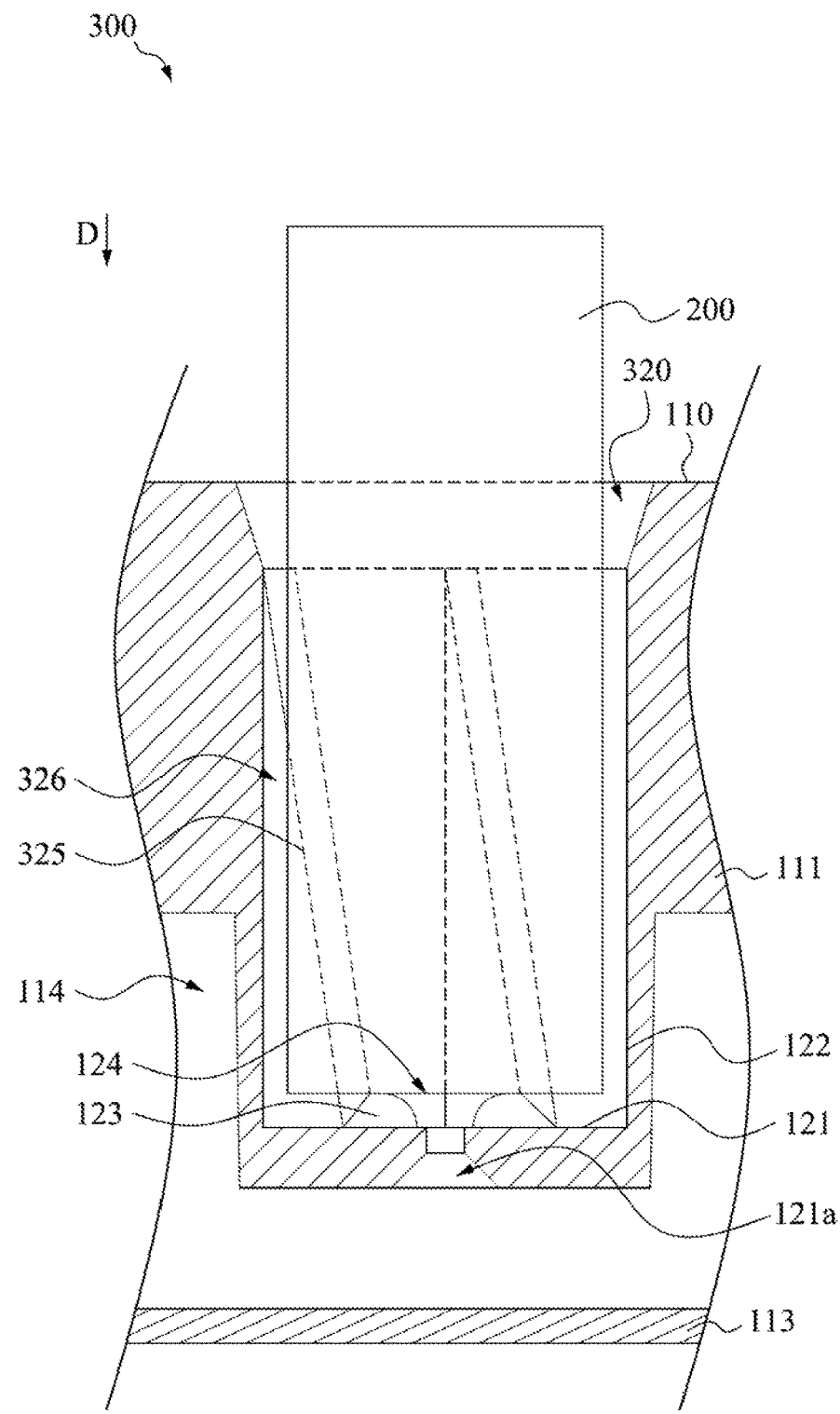
FIG. 5 is another partial cross-sectional view of the support apparatus in FIG. 2 taken along line 4-4 according to another embodiment.

Reference is made to FIG. 5. FIG. 5 is another partial cross-sectional view of the support apparatus 300 in FIG. 2 taken along line 4-4 according to another embodiment.

As shown in FIG. 5, in the embodiment, the support apparatus 300 includes a tray 110 and a plurality of recessed structures 320 (only one recessed structure 320 is depicted in FIG. 5 for simplification). Each of the recessed structures 320 includes a support surface 121, a plurality of first spacers 123, and a plurality of second spacers 325, in which the tray 110, the support surface 121 and the first spacers 123 are similar to those in the embodiment of FIG. 4, so these similar components can be referred to the foregoing discussions and therefore are not repeated here to avoid duplicity. It should be pointed out that the difference between the recessed structures 320 of the present embodiment and the recessed structures 120 of the embodiment shown in FIG. 4 is that the second spacers 325 in each of the recessed structures 320 are disposed at the sidewall 122 and helically extend relative to the direction D. Hence, the length of each of the second flow channels 326 can be increased, and the path along which the gas per unit volume flows through the side surface of the corresponding electronic component 200 is correspondingly increased, so that the cooling efficiency to the electronic components 200 can be further improved.

According to the foregoing recitations of the embodiments of the disclosure, it can be seen that in the support apparatus of the disclosure, gas is provided into the cavity of the tray and the exhaust holes having a pressurized structure are respectively formed at the bottom of the recessed structures, so the gas can be pressurized by the exhaust holes to respectively form jet airflows to forcibly dissipate the heat produced by the electronic components, thereby increasing the cooling efficiency to the electronic components. Furthermore, in the support apparatus of the disclosure, the spacers disposed at the bottom and the sidewall of each of the recessed structures can form flow channels, so the gas flows into the flow channels from the exhaust hole can uniformly and forcibly dissipate the heat produced at the bottom and the side surface of the corresponding electronic component. In addition, the support apparatus of the disclosure can make the gas form a high steady pressure in the cavity by the gas supply module, so as to ensure that the flows of the gas entering the recessed structures 120 respectively from the exhaust holes 121*a* have the same flow rate. Therefore, the support apparatus of the disclosure not only can effectively improve the cooling efficiency to the electronic components, but also can effectively maintain the electronic components to a uniform temperature.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A support apparatus for supporting electronic components, the support apparatus comprising:
   a tray having a cavity therein and at least one intake hole communicated with the cavity; and
   a plurality of recessed structures disposed on the tray and recessed toward the cavity, each of the recessed structures being configured to accommodate at least a part of a corresponding one of the electronic components and comprising:
     a support surface having an exhaust hole communicated with the cavity; and
     a plurality of first spacers disposed on the support surface of a corresponding one of the recessed structures, wherein when a corresponding one of the electronic components is supported on the first spacers, any adjacent two of the first spacers and the corresponding one of the electronic components form a first flow channel.

2. The support apparatus of claim 1, wherein a portion of the exhaust hole adjoining the cavity has a first aperture, a portion of the exhaust hole adjoining the support surface has a second aperture smaller than the first aperture.

3. The support apparatus of claim 1, wherein the first spacers are radially arranged relative to the exhaust hole.

4. The support apparatus of claim 1, wherein each of the recessed structures further has a sidewall connected to the support surface thereof and comprises a plurality of second spacers disposed on the sidewall, each of the second spacers is connected to a corresponding one of the first spacers and configured to be abutted against by a corresponding one of the electronic components, wherein any adjacent two of the second spacers and the corresponding one of the electronic components form a second flow channel communicated with the first flow channel.

5. The support apparatus of claim 4, wherein at least one of the recessed structures is recessed toward the cavity substantially along a direction, and the second spacers in the at least one of the recessed structure extend along the direction.

6. The support apparatus of claim 4, wherein at least one of the recessed structures is recessed toward the cavity substantially along a direction, and the second spacers in the at least one of the recessed structures helically extend relative to the direction.

7. The support apparatus of claim 1, wherein the tray further has a support board, a connection board, and a base board sequentially connected to form the cavity, and the recessed structures are disposed on the support board and recessed toward the base board.

8. The support apparatus of claim 7, wherein the at least one intake hole is located at the connection board.

9. The support apparatus of claim 1, further comprising:
   a gas supply module connected to the intake hole and configured to supply a gas to the cavity, wherein the gas form a high static pressure in the cavity.

10. The support apparatus of claim 9, further comprising:
    a thermostat module connected between the intake hole and the gas supply module and configured to adjust a temperature of the gas.

* * * * *